United States Patent [19]

Jeong-Gyoo

[11] Patent Number: 5,155,056
[45] Date of Patent: Oct. 13, 1992

[54] PROCESS FOR FORMATION OF CELLS HAVING SELF-ALIGNED CAPACITOR CONTACTS, AND STRUCTURE THEREOF

[75] Inventor: Kim Jeong-Gyoo, Seoul, Rep. of Korea

[73] Assignee: Goldstar Electron Co., Ltd., Rep. of Korea

[21] Appl. No.: 679,956

[22] Filed: Apr. 3, 1991

[30] Foreign Application Priority Data

Apr. 4, 1990 [KR] Rep. of Korea ............... 90-4662

[51] Int. Cl.$^5$ .................................... H01L 21/70
[52] U.S. Cl. ........................ 437/47; 437/44; 437/48; 437/52; 437/60; 437/228; 437/233; 437/235; 437/919
[58] Field of Search ............ 437/44, 47, 48, 52, 437/60, 919, 228, 233, 235; 357/23.6; 365/149; 156/643

[56] References Cited

U.S. PATENT DOCUMENTS 4,977,102 12/1990 Ema ........................ 437/52

FOREIGN PATENT DOCUMENTS

0190377 8/1988 Japan .
0094561 4/1990 Japan .
0206163 8/1990 Japan .

*Primary Examiner*—Tom Thomas
*Attorney, Agent, or Firm*—Blakely Sokoloff Taylor & Zafman

[57] ABSTRACT

A process for formation of cell having a self-aligned capacitor contact and a structure thereof are disclosed. The capacitance of the capacitor is increased, and the leakage of the current is decreased through the provision of the self-aligned capacitor contact and by lowering the impurity concentration in the p-n junction of the capacitor. The conventional DRAM cell has disadvantages such that: the n+ region connected to the node polysilicon of the capacitor section gives an adverse effect to the leakage of current; and there is the risk that the node polysilicon and the gate polysilicon might be contacted due to the misalignment during the photolithographic process for connecting the n+ region to the node polysilicon after forming the stack polysilicon. In order to reduce this risk, the gap between the gate polysilicon and the node polysilicon has to be increased, but this increases the area of the DRAM cell. The present invention overcomes the above disadvantages in the following manner. That is, a side wall 208a is separately formed in such manner that the p-n junction of the capacitor section and the p-n junction of the bit line contact should be n− and n+ respectively, with an n+ ion implantation being carried out thereafter. Further, a side wall 208 is formed, and at the same time, an n− region contact for the capacitor is formed, in such a manner that the contact between the node electrode and the n− region should be self-aligned.

2 Claims, 8 Drawing Sheets

PROCESS FOR FORMATION OF CELLS HAVING SELF-ALIGNED CAPACITOR CONTACTS, AND STRUCTURE THEREOF

FIELD OF THE INVENTION

The present invention relates to a process for formation of DRAM cells, and a structure thereof, and particularly to a process for formation of DRAM cells and a structure thereof, in which the P-N junctions of the capacitors are formed by doping an impurity in a low concentration, so that a large capacitance should be provided, and that the leakage of current should be inhibited.

BACKGROUND OF THE INVENTION

Figure 1:
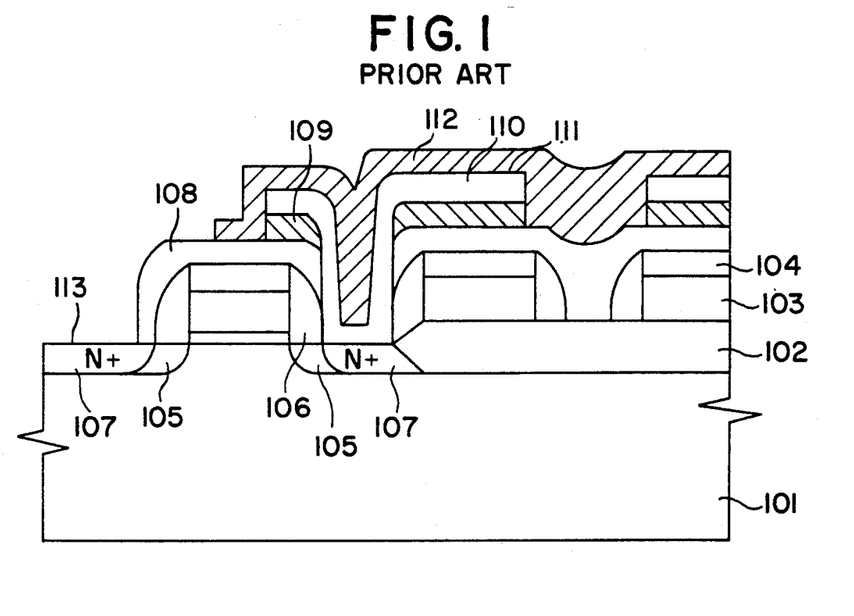
FIG. 1 is a sectional view of the conventional stacked cell structure.

FIG. 1 is a sectional view of the conventional stacked cells, and the formation process is as described below. First, a field oxide layer 102 is selectively grown upon a p type silicon substrate 101, and then, a gate poly 103 and an oxide layer 104 are stacked. Then, a gate pattern is formed, and an n— region 105 is formed upon the silicon substrate 101. Then, side walls 106 are formed, and an n+ region 107 is formed, in such a manner that the portion connected to a node polysilicon 110 and the portion 113 connected to the bit line should become n+ regions. Thereafter, an HTO (high temperature oxide) 108 is formed, and a stack poly-silicon 109 is stacked upon the HTO 108. Then a buried contact is drilled by applying a photolithography process using a mask and then, a node polysilicon 110 is formed. Further, a capacitor insulating layer 111 is formed upon the node polysilicon 110, and a plate polysilicon 112 is stacked, thereby forming the capacitor section of the DRAM cell.

After forming the capacitor section, a contact portion 113 is formed for the contact of the bit lines. However, in the conventional DRAM cell manufactured through the process described above, the n+ region 107 which is connected to the node polysilicon 110 of the capacitor section gives an adverse influence to the leakage of current in the DRAM cell. Further, during the photolithography process for connecting the n+ region 107 to the node polysilicon 110 after stacking the stack polysilicon 109, there exists the risk that the node polysilicon 110 and the gate polysilicon 103 might be contacted to each other due to the misalingment. In order to reduce this risk, the gap between the gate polysilicon 103 and the node polysilicon 110 should be made large, and this brings the disadvantage that it increases the area of the DRAM cell.

SUMMARY OF THE INVENTION

Therefore it is the object of the present invention to provide a process for formation of DRAM cells, in which all the above described disadvantages are overcome.

BRIEF DESCRIPTION OF THE DRAWINGS

The above object and other advantages of the present invention will become more apparent by describing in detail the preferred embodiment of the present invention with reference to the attached drawings in which.

DESCRIPTION OF THE PREFERRED EMBODIMENT

Figure 2A:
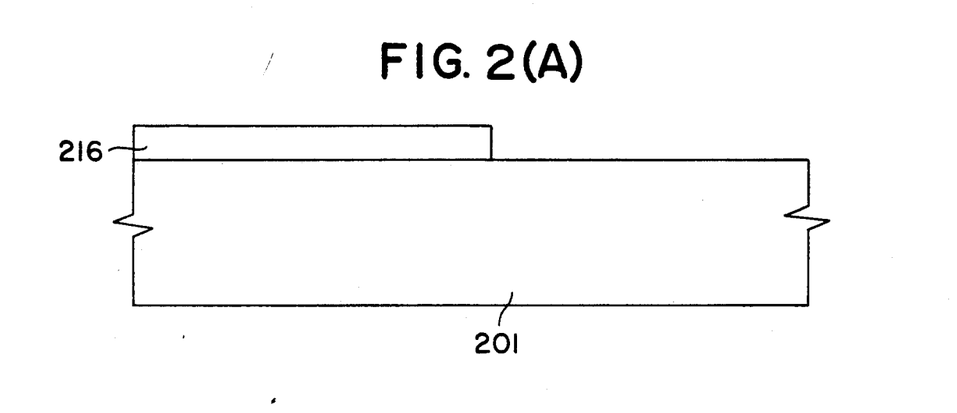
FIGS. 2A to 2N illustrate the process for formation of the DRAM cell having a self-aligned capacitor contact according to the present invention.
Figure 2B:
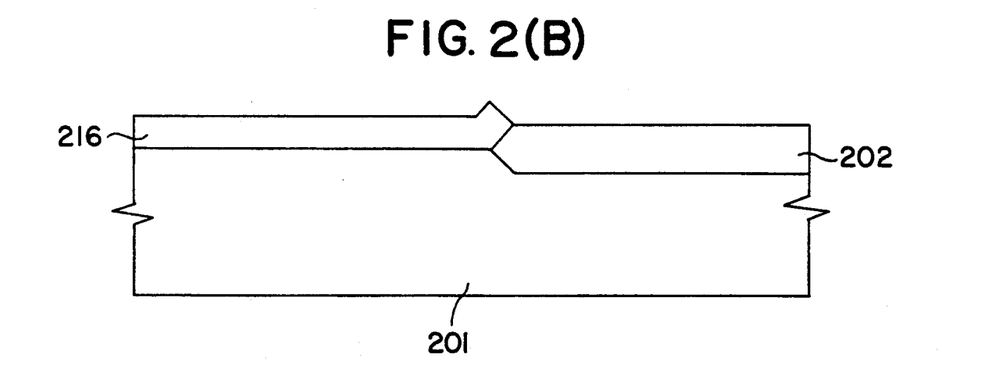
Figure 2C:
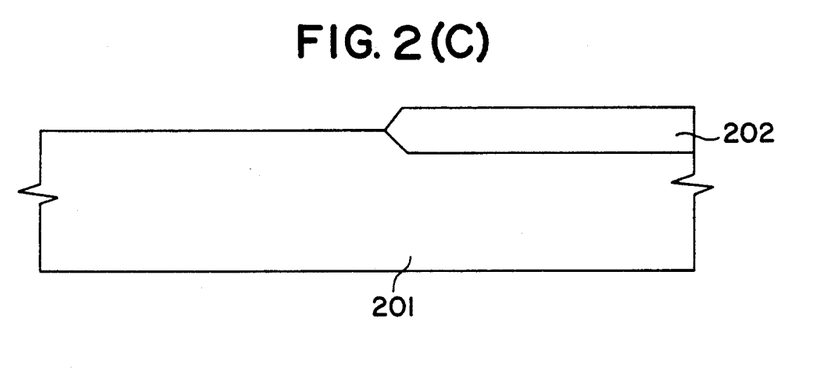
Figure 2D:
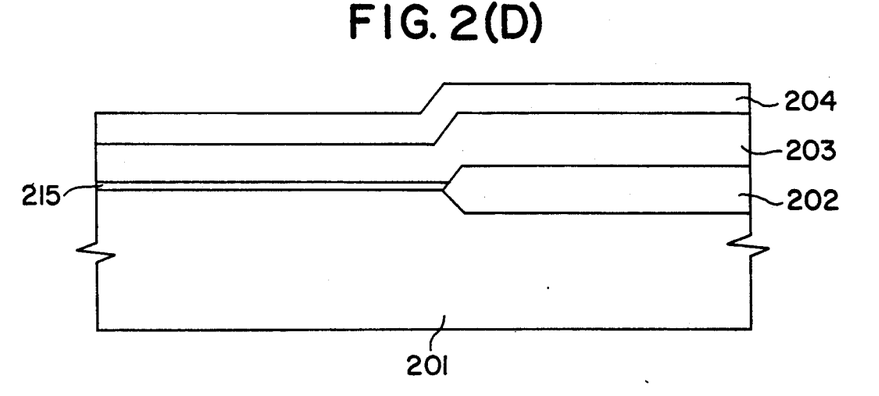
Figure 2E:
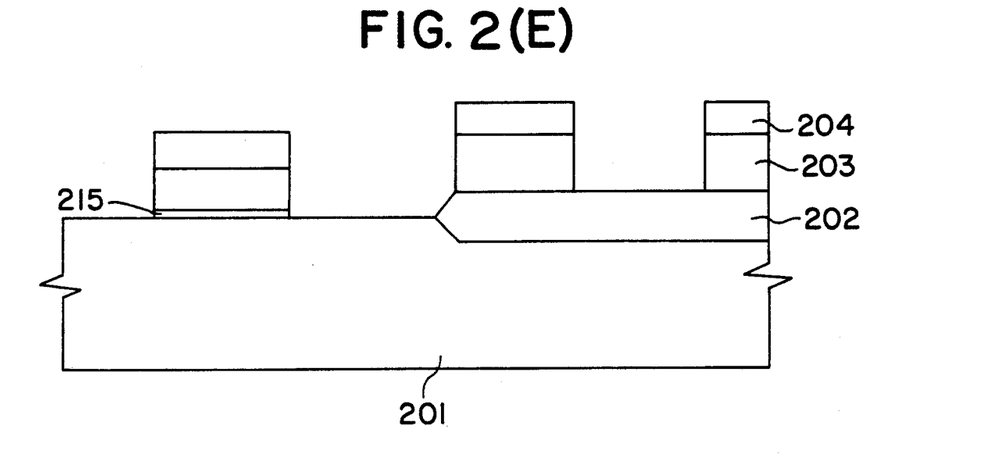
Figure 2F:
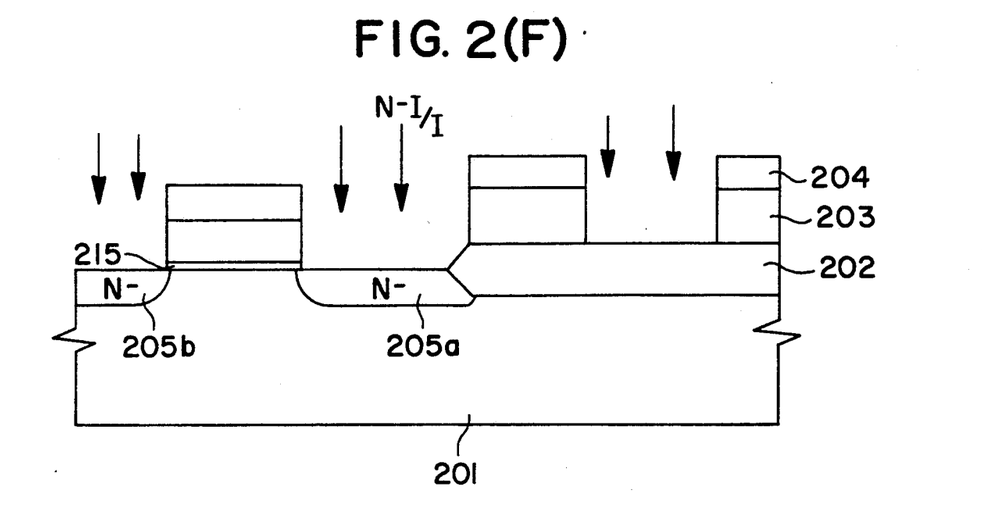
Figure 2G:
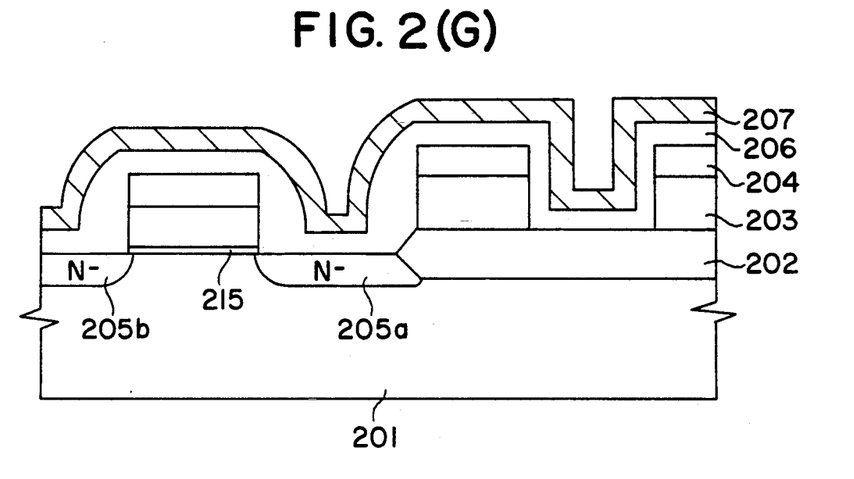

First, as shown in FIG. 2A, a thin oxide layer 215 and a nitride layer (Si3N4) 216 formed upon a p type silicon substrate 201, and the portion of the nitride layer 216 where a field oxide layer is to be formed is etched. As shown in FIG. 2B, a field oxide layer 202 is selectively grown, and, as shown in FIG. 2C, the nitride layer 216 is removed. Then, as shown in FIG. 2D, a gate polysilicon 203 and an oxide layer 204 are stacked, and, as shown in FIG. 2E, a gate pattern is formed. Then, as shown in FIG. 2F, n— ion implantations are carried out to form n— regions 205a,205b, and, as shown in FIG. 2G, an oxide layer 206 and a stack polysilicon 207 is stacked.

Figure 2H:
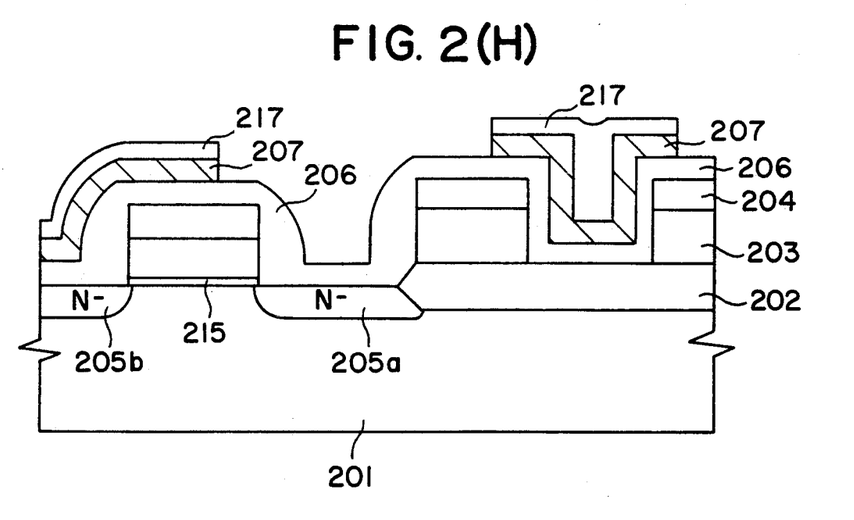
Figure 2I:
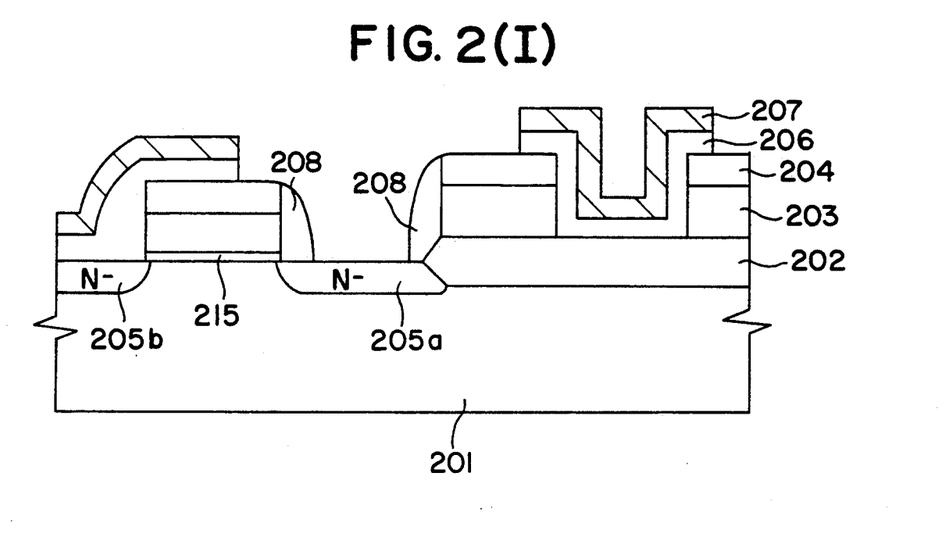

Thereafter, as shown in FIG. 2H, the stack polysilicon 207 is patterned by using a photoresist 217, and then, the photoresist 217 is removed. Then as shown in FIG. 2I, the oxide layer 206 is subjected to a reactive ion etching to form a side wall 208 in such a manner that the contact between the node electrode (also known as the storage electrode) and the n— region 205a should be self-aligned. Under this condition, if the doping concentration of the n— region 205a is to be raised, an ion implantation has to be performed using the stack polysilicon 207 as the mask.

Figure 2J:
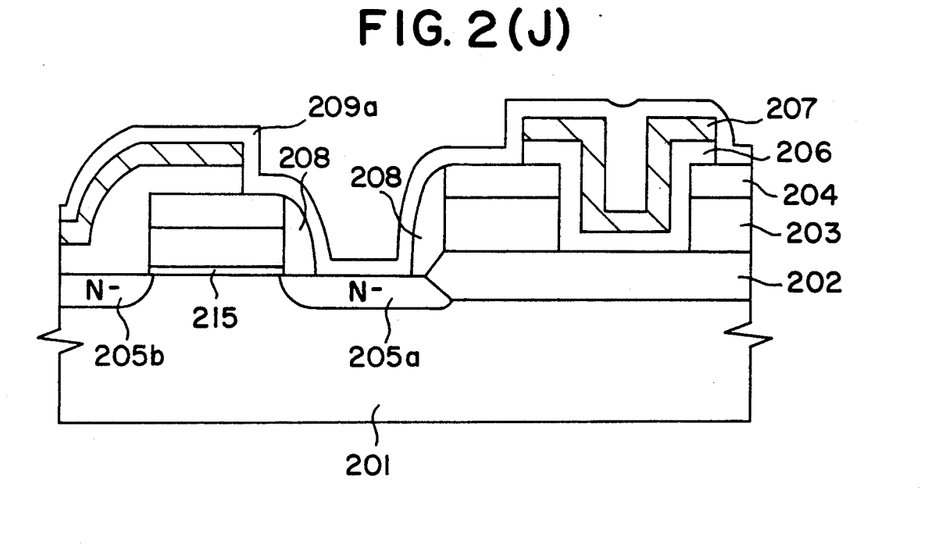
Figure 2K:
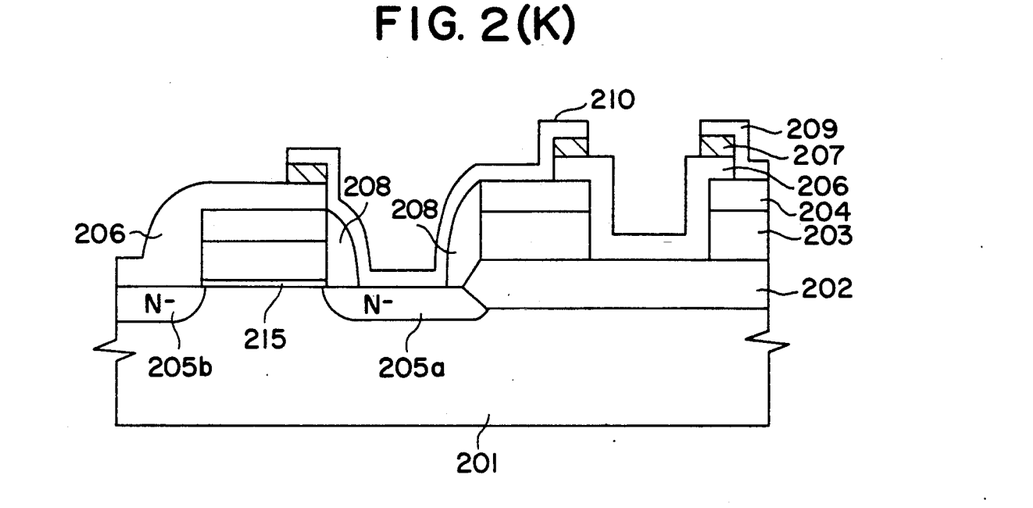
Figure 2L:
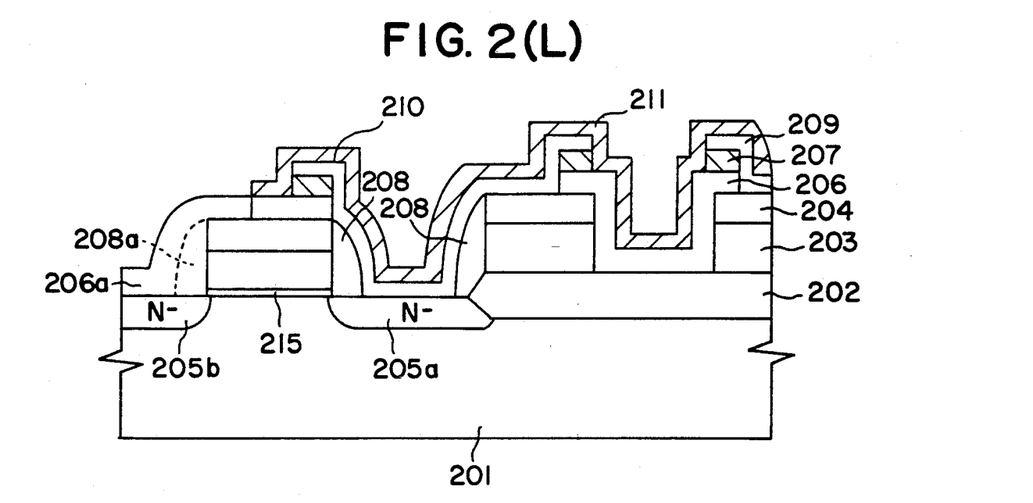
Figure 2M:
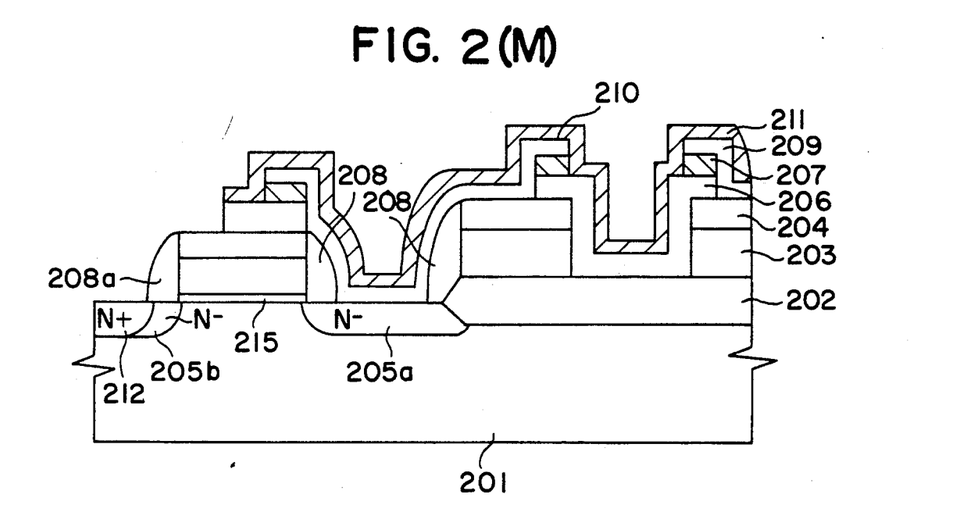
Figure 2N:
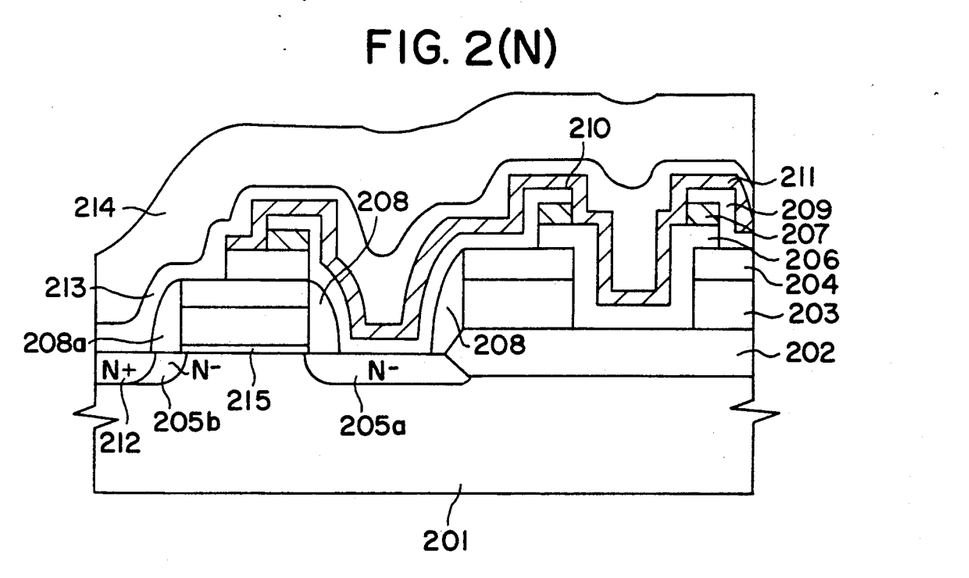

Thereafter, as shown in FIG. 2J, a polysilicon 209a is stacked upon the self-aligned contact, and, as shown in FIG. 2K, a node electrode 209 which is one of the electrodes of the capacitor is patterned, with a capacitor insulating layer 210 being formed thereupon. Then as shown in FIG. 2L, a plate elecrode 211 which is another one of the electrodes of the capacitor is patterned, and, as shown in FIG. 2M, the oxide layer (the portion of 206a) is subjected to a reactive ion etching to form a side wall 208a, with an n+ region 212 for the contact of the bit lines being formed thereafter. Then as shown in FIG. 2N, an insulating oxide layer 213 and a flattening oxide layer 214 are stacked thereupon.

According to the above described process for formation of the DRAM cell having a self-aligned capacitor contact, the current leakage of the DRAM cell is reduced by lowering the doping concentration of the p-n junctions of the capacitor section, and the area of the capacitor is increased by making the node electrode 209 of the capacitor self-aligned within the n— region 205. Further, the risk of contact between the gate polysilicon 203 and the node electrode 209 due to a misalignment between them is eliminated, and the process is simplified because the mask is not used, and because the p-n junction of the capacitor section and the p-n junction of the bit line contact are provided in the form of n— and n+ regions respectively. Further, the n+ and p+ regions of the peripheral circuits are formed after forming the capacitor section, and therefore, shallow junctions can be formed.

What is claimed is:

1. A process for formation of a cell having a self-aligned capacitor contact, comprising:

a step of forming a thin oxide layer and a field oxide layer upon a substrate, and stacking a gate polysilicon layer and an oxide layer to form a gate pattern;

a step of forming n− regions (205a, 205b), and stacking an oxide layer (206) and a layer of polysilicon (207);

a step of defining a region of a storage electrode contact for connecting a storage electrode of a capacitor to said n− region (205a) by patterning said layer of polysilicon (207);

a step of simultaneously forming a side wall spacer (208) and said storage electrode contact by subjecting said oxide layer (206) to a reactive ion etching to self-align the storage electrode contact between the storage electrode of the capacitor and said n− region (205a);

a step of forming a storage electrode and a capacitor insulating layer on said storage electrode contact, and then, forming a plate electrode thereupon;

a step of subjecting said oxide layer (206) to a separate step of a reactive ion etching to form a side wall (208a);

a step of forming an n+ region for a bit line contact; and a step of successively forming an insulating oxide layer and a planarizing oxide layer after the formation of said n+ region.

2. The process for formation of a cell having a self-aligned capacitor contact as claimed in claim 1, wherein said side wall 208a is separately formed in such a manner that the p-n junction of said capacitor section and the p-n junction of said bit line contact should become n− and n+ respectively, and n+ ion implantations are carried out.

* * * * *